(12) United States Patent
Sakurai et al.

(10) Patent No.: US 12,089,342 B2
(45) Date of Patent: Sep. 10, 2024

(54) INSULATED CIRCUIT BOARD

(71) Applicant: MITSUBISHI MATERIALS CORPORATION, Tokyo (JP)

(72) Inventors: Akira Sakurai, Saitama (JP); Nobuyuki Terasaki, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 238 days.

(21) Appl. No.: 17/793,721

(22) PCT Filed: Mar. 16, 2021

(86) PCT No.: PCT/JP2021/010548
§ 371 (c)(1),
(2) Date: Jul. 19, 2022

(87) PCT Pub. No.: WO2021/187464
PCT Pub. Date: Sep. 23, 2021

(65) Prior Publication Data
US 2023/0091454 A1   Mar. 23, 2023

(30) Foreign Application Priority Data

Mar. 18, 2020 (JP) ................................ 2020-047956
Mar. 12, 2021 (JP) ................................ 2021-040435

(51) Int. Cl.
*H05K 1/02* (2006.01)
*H05K 3/00* (2006.01)

(52) U.S. Cl.
CPC ......... *H05K 3/0061* (2013.01); *H05K 1/0204* (2013.01); *H05K 2201/032* (2013.01); *H05K 2203/1194* (2013.01)

(58) Field of Classification Search
CPC ............... H05K 3/0061; H05K 1/0204; H05K 2201/032; H05K 2203/1194
See application file for complete search history.

(56) References Cited

U.S. PATENT DOCUMENTS 9,735,085 B2  8/2017 Terasaki et al.
2013/0010429 A1*  1/2013 Tonomura ............. H01L 23/473
                                                      228/124.1
(Continued)

FOREIGN PATENT DOCUMENTS

EP    2296177 A1   3/2011
JP    3171234 B2   5/2001
(Continued)

OTHER PUBLICATIONS

1 Supplementary European Search Report mailed Mar. 22, 2024, issued for EP21772541.5.
(Continued)

*Primary Examiner* — Sherman Ng
(74) *Attorney, Agent, or Firm* — Locke Lord LLP

(57) ABSTRACT

In an insulating circuit substrate, aluminum sheets formed of aluminum or an aluminum alloy are laminated and bonded to a surface of a ceramic substrate and, in the aluminum sheets, Cu is solid-solubilized at a bonding interface with the ceramic substrate and a ratio B/A between a Cu concentration A mass % at the bonding interface and a Cu concentration B mass % at a position of 100 μm in a thickness direction from the bonding interface to the aluminum sheets side is 0.30 or more and 0.85 or less.

20 Claims, 5 Drawing Sheets

(56) References Cited

U.S. PATENT DOCUMENTS

2014/0192486 A1    7/2014  Kuromitsu et al.
2015/0034367 A1*   2/2015  Nagatomo .......... H01L 23/3735
                                                    174/257

FOREIGN PATENT DOCUMENTS

| JP | 2012-059836 A | 3/2012 |
| JP | 5359953 B2 | 12/2013 |
| WO | 2013/024813 A1 | 2/2013 |
| WO | 2019/146464 A1 | 8/2019 |

OTHER PUBLICATIONS

International Search Report mailed Jun. 8, 2021, issued for PCT/JP2021/010548 and English translation thereof.

* cited by examiner

INSULATED CIRCUIT BOARD

TECHNICAL FIELD

The present invention relates to an insulating circuit substrate formed by bonding a ceramic substrate and an aluminum sheet formed of aluminum or an aluminum alloy.

The present application claims priority on Japanese Patent Application No. 2020-047956 filed on Mar. 18, 2020, and Japanese Patent Application No. 2021-040435 filed on Mar. 12, 2021, the contents of which are incorporated herein by reference.

BACKGROUND ART

Power modules, LED modules, and thermoelectric modules have a structure in which power semiconductor elements, LED elements, and thermoelectric elements are bonded to an insulating circuit substrate. In the insulating circuit substrates, a circuit layer formed of a conductive material is formed on one surface of an insulating layer.

In addition, in the insulating circuit substrates described above, insulating circuit substrates are also provided with a structure in which a metal plate with excellent electric conductivity is bonded to one surface of a ceramic substrate to form a circuit layer and a metal plate with an excellent heat dissipation property is bonded to the other surface to form a metal layer.

Furthermore, insulating circuit substrates with a heat sink are also provided, in which a heat sink is bonded to the metal layer side of the insulating circuit substrate in order to efficiently dissipate the heat generated from the elements and the like mounted on the circuit layer.

For example, the insulating circuit substrate shown in Patent Document 1 has a structure provided with an insulating circuit substrate in which a circuit layer formed of an aluminum sheet is formed on one surface of a ceramic substrate and a metal layer formed of an aluminum sheet is formed on the other surface, as well as a semiconductor element bonded via solder material on this circuit layer.

An Al—Si-based brazing material is usually used when bonding the ceramic substrate and the aluminum sheets which are the metal layer and the circuit layer.

It was necessary to ensure sufficient bonding reliability for the insulating circuit substrates described above, even in a case of being subjected to thermal cycles.

Therefore, Patent Document 2 proposes a technique to more firmly bond a ceramic substrate and an aluminum sheet, which includes a step of forming a Cu layer by adhering Cu to at least one of the bonding surfaces of a ceramic substrate and an aluminum sheet, and a step of pressing and heating the ceramic substrate and the aluminum sheet laminated via the Cu layer in the lamination direction.

In Patent Document 2, Cu is diffused to the aluminum sheet side, the Cu concentration in a range of 50 μm from the bonding interface is in a range of 0.05 to 5 wt %, an Al and Cu eutectic phase is formed at the width direction end portions of the aluminum sheet, and the bonding reliability is excellent.

Recently, high temperature semiconductor devices have been provided in which the semiconductor elements are formed of SiC or the like and operate at higher temperatures than in the related art.

For this reason, the insulating circuit substrates described above are used in more severe environments than in the related art and there is a demand to suppress breaking in the ceramic substrate, deformation of the circuit layer, and the like, even in a case of being subjected to harsh thermal cycles.

PRIOR ART DOCUMENTS

Patent Document

Patent Document 1: Japanese Patent No. 3171234
Patent Document 2: Japanese Patent No. 5359953

DISCLOSURE OF INVENTION

Problems to be Solved by the Invention

The present invention was made in consideration of the circumstances described above and the present invention aims to provide an insulating circuit substrate which is able to suppress breaking in a ceramic substrate, deformation of an aluminum sheet, and the like, even in a case of being subjected to severe thermal cycles, and which has excellent bonding reliability between the ceramic substrate and a circuit layer.

Solutions for Solving the Problems

In order to solve the problems described above, an insulating circuit substrate according to an aspect of the present invention is an insulating circuit substrate in which an aluminum sheet formed of aluminum or an aluminum alloy is laminated and bonded to a surface of a ceramic substrate, in which, in the aluminum sheet, Cu is solid-solubilized at a bonding interface with the ceramic substrate, and a ratio B/A between a Cu concentration A mass % at the bonding interface and a Cu concentration B mass % at a position of 100 μm in a thickness direction from the bonding interface to the aluminum sheet side is 0.30 or more and 0.85 or less.

The insulating circuit substrate includes a ceramic substrate and an aluminum sheet formed of aluminum or aluminum alloy, in which the aluminum sheet is laminated and bonded to the surface of the ceramic substrate.

According to the insulating circuit substrate with this configuration, Cu is solid-solubilized at the bonding interface side of the aluminum sheet with the ceramic substrate, and a ratio B/A between a Cu concentration A mass % at the bonding interface and a Cu concentration B mass % at a position of 100 μm in a thickness direction from the bonding interface to the aluminum sheet side is set to 0.30 or more and 0.85 or less. For this reason, Cu is sufficiently diffused to the inside of the aluminum sheet formed of aluminum or aluminum alloy and a region where Cu is solid-solubilized in a supersaturated manner is formed in the vicinity of the bonding interface of the aluminum sheet. For this reason, it is possible to suppress deformation of the aluminum sheet and the occurrence of cracks in the aluminum sheet after being subjected to thermal cycles.

In addition, since Cu is solid-solubilized in the Al matrix, a hard Al—Cu eutectic phase is not formed and it is possible to suppress the occurrence of breaking in the ceramic substrate.

In the insulating circuit substrate according to an aspect of the present invention, in the aluminum sheet, the Cu concentration B at a position of 100 μm in the thickness direction from the bonding interface is preferably set in a range of 0.04 mass % or more and 0.96 mass % or less.

In this case, Cu diffuses sufficiently toward the inside of the aluminum sheet and a region where Cu is solid-solubilized in a supersaturated manner is sufficiently formed in the vicinity of the bonding interface of the aluminum sheet. For this reason, it is possible to further suppress the deformation of the aluminum sheet and the occurrence of cracks in the aluminum sheet after being subjected to thermal cycles.

Furthermore, in the insulating circuit substrate according to an aspect of the present invention, after carrying out 2000 thermal cycles, in which one cycle is holding at −65° C. for 5 minutes and holding at 150° C. for 5 minutes, in a region up to 100 μm in the thickness direction from the bonding interface of the aluminum sheet, Al—Cu compound particles including Al and Cu are preferably precipitated at a crystal grain boundary and in a crystal grain of the aluminum sheet.

In this case, the vicinity of the bonding interface of the aluminum sheet is strengthened by the Al—Cu compound particles and it is possible to reliably suppress the deformation of the aluminum sheet and the occurrence of cracks in the aluminum sheet after being subjected to thermal cycles.

In addition, in the insulating circuit substrate according to an aspect of the present invention, in a range of 50 μm in the thickness direction from the bonding interface to the aluminum sheet side, a number density of the Al—Cu compound particles precipitated after carrying out 2000 thermal cycles, in which one cycle is holding at −65° C. for 5 minutes and holding at 150° C. for 5 minutes, is preferably in a range of 0.50 particles/μm$^2$ or more and 8.50 particles/m$^2$ or less.

In this case, in a range of 50 μm in the thickness direction from the bonding interface to the aluminum sheet side, the number density of the Al—Cu compound particles precipitated after carrying out 2000 thermal cycles, in which one cycle is holding at −65° C. for 5 minutes and holding at 150° C. for 5 minutes, is set to 0.50 particles/m$^2$ or more. For this reason, the deformation resistance of the aluminum sheet in the vicinity of the bonding interface increases and it is possible to further suppress deformation of the aluminum sheet. In addition, the number density of the Al—Cu compound particles is set to 8.50 particles/μm$^2$ or less. For this reason, the aluminum sheet in the vicinity of the bonding interface does not become harder than necessary and it is possible to further suppress breaking in the ceramic substrate.

Furthermore, in the insulating circuit substrate according to an aspect of the present invention, an average of equivalent circle diameters of the Al—Cu compound particles precipitated after carrying out 2000 thermal cycles, in which one cycle is holding at −65° C. for 5 minutes and holding at 150° C. for 5 minutes, is preferably in a range of 30 nm or more and 130 nm or less.

In this case, the average of the equivalent circle diameters of the Al—Cu compound particles precipitated after carrying out 2000 thermal cycles, in which one cycle is holding at −65° C. for 5 minutes and holding at 150° C. for 5 minutes, is set in the range described above. For this reason, it is possible to sufficiently deposit and strengthen the aluminum sheet in the vicinity of the bonding interface and to further suppress deformation of the aluminum sheet.

In addition, in the insulating circuit substrate according to an aspect of the present invention, at the bonding interface between the aluminum sheet and the ceramic substrate, an area ratio of an Al—Cu eutectic phase in a range of 1 mm from an end portion of the bonding interface toward a center in a width direction is preferably 30% or less.

In this case, the area ratio of the Al—Cu eutectic phase at the bonding interface between the aluminum sheet and the ceramic substrate is limited to 30% or less, thus, the hard Al—Cu eutectic phase is small and it is possible to suppress the occurrence of breaking in the ceramic substrate.

Effects of Invention

According to an aspect of the present invention, it is possible to provide an insulating circuit substrate which is able to suppress breaking in a ceramic substrate, deformation of the circuit layer (the metal layer), and the like, even in a case of being subjected to severe thermal cycles, and which has excellent bonding reliability between the ceramic substrate and the circuit layer (the metal layer).

BRIEF DESCRIPTION OF DRAWINGS

FIG. 3(a) is before being subjected to thermal cycles and FIG. 3(b) is after being subjected to thermal cycles.

EMBODIMENTS FOR CARRYING OUT THE INVENTION

A description will be given below of embodiments of the present invention with reference to the accompanying drawings.

Figure 1:
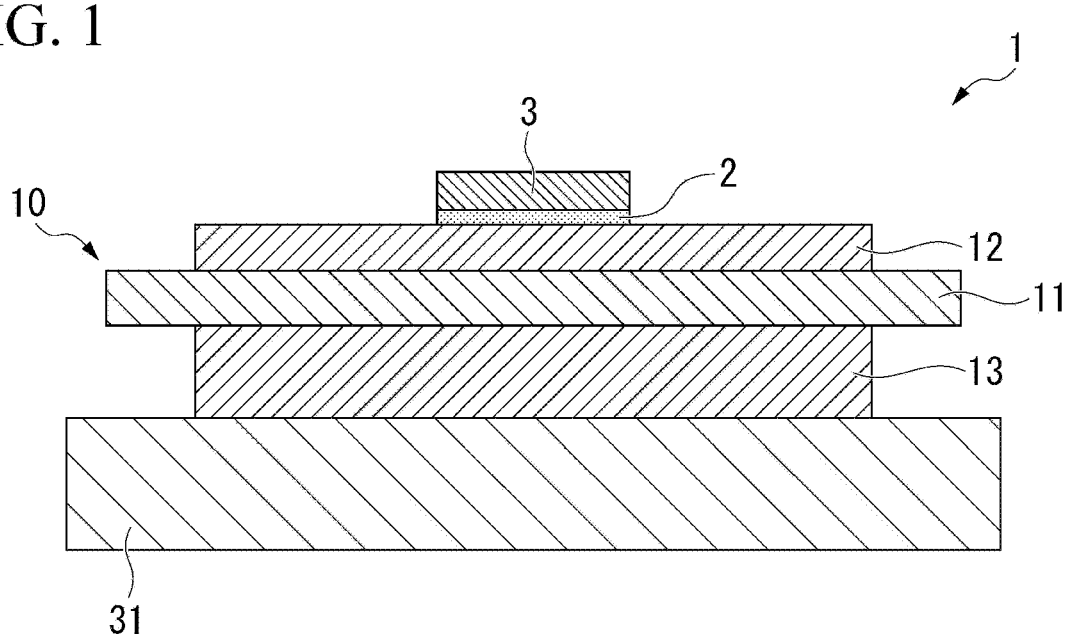
FIG. 1 is a schematic explanatory diagram of a power module using an insulating circuit substrate, which is an embodiment of the present invention.

FIG. 1 shows an insulating circuit substrate 10, which is an embodiment of the present invention, and a power module 1 using this insulating circuit substrate 10.

The power module 1 shown in FIG. 1 includes the insulating circuit substrate 10, a semiconductor element 3 bonded via a solder layer 2 to one side of the insulating circuit substrate 10 (upper side in FIG. 1), and a heat sink 31 arranged on the other side of the insulating circuit substrate 10 (lower side in FIG. 1).

The solder layer 2 is made of, for example, Sn—Ag-based, Sn—Cu-based, Sn—In-based, or Sn—Ag—Cu-based solder material (so-called lead-free solder material).

The semiconductor element 3 is an electronic component provided with a semiconductor and various semiconductor elements are selected according to the necessary function.

As shown in FIG. 1, the insulating circuit substrate 10 includes a ceramic substrate 11, a circuit layer 12 arranged on one surface of the ceramic substrate 11 (upper side in FIG. 1), and a metal layer 13 formed on the other surface of the ceramic substrate 11 (lower side in FIG. 1).

The ceramic substrate 11 prevents electrical connection between the circuit layer 12 and the metal layer 13 and is formed of $Si_3N_4$ (silicon nitride), with high insulation properties. In addition, the thickness of the ceramic substrate 11 is set in a range of 0.2 mm or more and 1.5 mm or less and, in the present embodiment, the thickness is set to 0.32 mm.

The circuit layer 12 is formed by bonding an aluminum sheet 22 formed of aluminum or an aluminum alloy to one surface of the ceramic substrate 11.

In the present embodiment, the circuit layer 12 is formed by bonding the aluminum sheet 22 formed of a rolled plate of aluminum with a purity of 99.99 mass % or higher (so-called 4N aluminum) to the ceramic substrate 11.

The metal layer 13 is formed by bonding an aluminum sheet 23 to the other surface of the ceramic substrate 11.

In the present embodiment, in the same manner as the circuit layer 12, the metal layer 13 is formed by bonding the aluminum sheet 23 formed of a rolled plate of aluminum with a purity of 99.99 mass % or higher (so-called 4N aluminum) to the ceramic substrate 11.

The heat sink 31 is for dissipating heat from the insulating circuit substrate 10 side. The heat sink 31 is formed of aluminum or an aluminum alloy with good thermal conductivity and, in the present embodiment, is formed of A6063 alloy. The thickness of the heat sink 31 is set in a range of 3 mm or more and 10 mm or less.

The heat sink 31 and the metal layer 13 of the insulating circuit substrate 10 are bonded using a brazing material.

Figure 2:
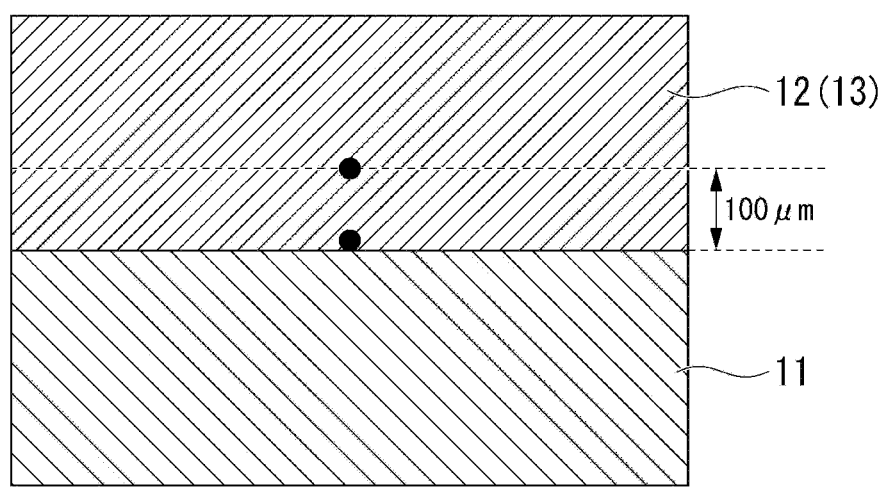
FIG. 2 is an enlarged explanatory diagram of the bonding interface between the circuit layer (the metal layer) and the ceramic substrate in the insulating circuit substrate, which is an embodiment of the present invention.

In the present embodiment, as shown in FIG. 2, in the circuit layer 12 and the metal layer 13, Cu is solid-solubilized at the bonding interface with the ceramic substrate 11 and a ratio B/A between a Cu concentration A mass % at the bonding interface and a Cu concentration B mass % at a position of 100 μm in a thickness direction from the bonding interface to the circuit layer 12 and the metal layer 13 side is set to 0.30 or more and 0.85 or less.

That is, Cu is sufficiently present even at a position of 100 μm in the thickness direction from the bonding interface to the circuit layer 12 and the metal layer 13 side.

When the ratio B/A is less than 0.30, there is a concern that the bonding interface may become hard, the bonding reliability may deteriorate, or Cu may not diffuse sufficiently into the circuit layer 12 (the metal layer 13); and thereby, deformation and breaking in the circuit layer 12 (the metal layer 13) may be caused.

When the ratio B/A exceeds 0.85, there is a concern that Cu may diffuse excessively, the entire circuit layer 12 (the metal layer 13) may become hard, and it may not be possible to relieve stresses in the circuit layer caused by temperature cycling; and thereby, breaking may be caused.

The upper limit of the ratio B/A between the Cu concentration A mass % at the bonding interface and the Cu concentration B mass % at a position of 100 μm in the thickness direction from the bonding interface to the circuit layer 12 and the metal layer 13 side is preferably 0.70 or less and more preferably 0.50 or less.

In the present embodiment, in the circuit layer 12 and the metal layer 13, the Cu concentration B at a position of 100 μm in the thickness direction from the bonding interface is preferably set in a range of 0.04 mass % or more and 0.96 mass % or less.

The lower limit of the Cu concentration B at a position of 100 μm in the thickness direction from the bonding interface is more preferably 0.10 mass % or more and even more preferably 0.14 mass % or more. On the other hand, the upper limit of the Cu concentration B at a position of 100 μm in the thickness direction from the bonding interface is more preferably 0.50 mass % or less and even more preferably 0.45 mass % or less.

In addition, in the present embodiment, an area ratio of the Al—Cu eutectic phase in a range of 1 mm from an end portion in the width direction of the bonding interface between either one of the circuit layer 12 or the metal layer 13 and the ceramic substrate 11 toward the center is preferably limited to 30% or less.

The area ratio of the Al—Cu eutectic phase at the bonding interface between either one of the circuit layer 12 or the metal layer 13 and the ceramic substrate 11 is preferably 20% or less and even more preferably 17% or less. The lower limit value of the area ratio of the Al—Cu eutectic phase may be 0% or may be 6.2% or more.

Furthermore, in the present embodiment, after carrying out 2000 thermal cycles, in which one cycle is holding at −65° C. for 5 minutes and holding at 150° C. for 5 minutes, in a region of up to 100 μm in the thickness direction from the bonding interface of the circuit layer 12 and the metal layer 13, Al—Cu compound particles 15 including Al and Cu are preferably precipitated on the crystal grain boundaries and in the crystal grain of the circuit layer 12 and the metal layer 13.

Figure 3:
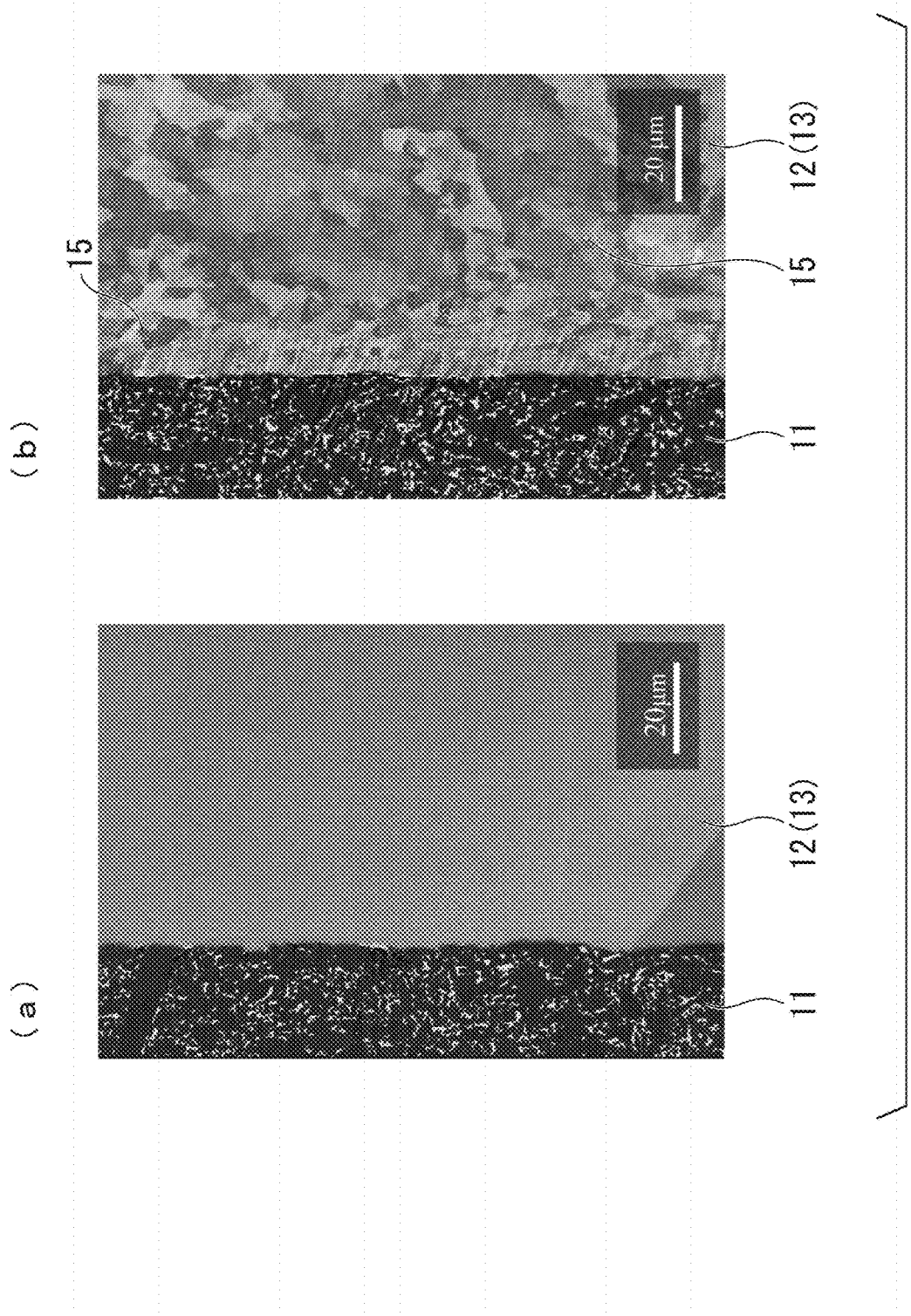
FIG. 3 is a photograph of the bonding interfaces between either one of the circuit layer (aluminum sheet) or the metal layer (aluminum sheet) and the ceramic substrate in an insulating circuit substrate, which is an embodiment of the present invention.
Figure 4:
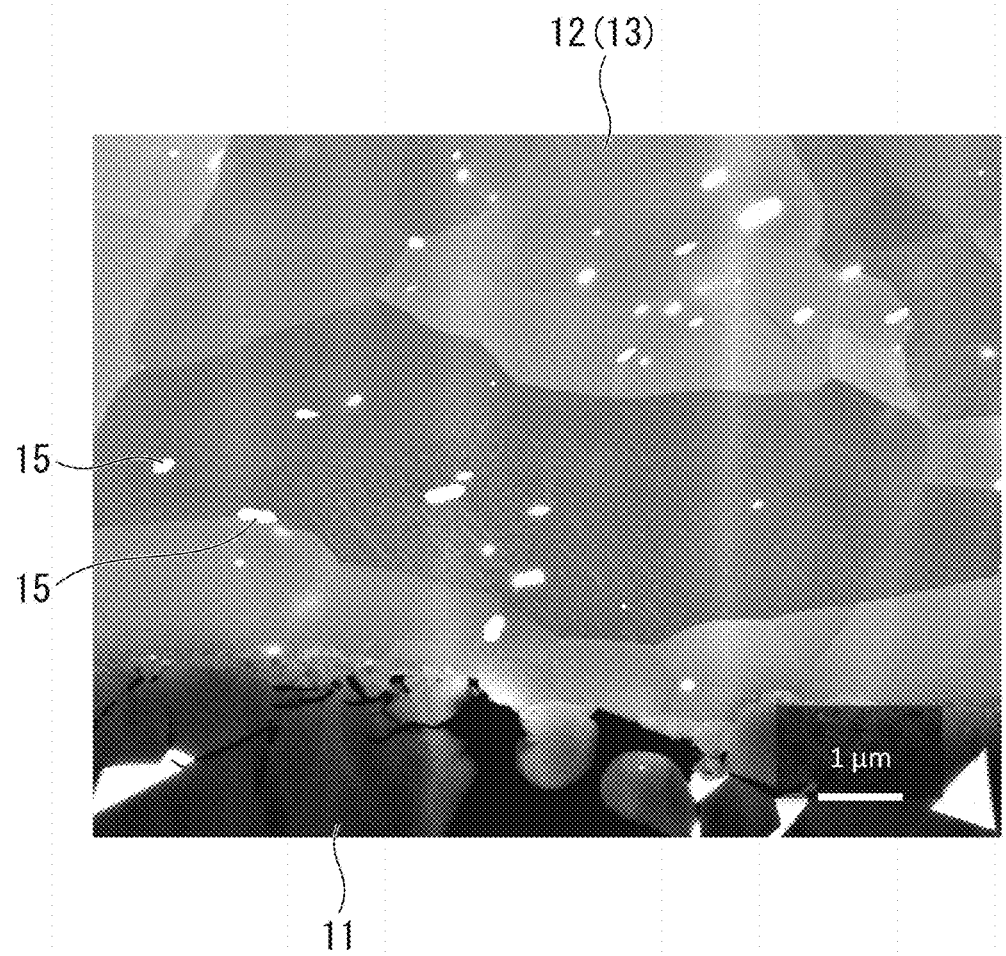
FIG. 4 is an enlarged photograph of FIG. 3(b).

FIG. 3 and FIG. 4 show the observation results of the bonding interface between either one of the circuit layer 12 or the metal layer 13 and the ceramic substrate 11 of the insulating circuit substrate 10 which is the present embodiment.

As shown in FIG. 3(a), in the state before being subjected to the thermal cycles, the Al—Cu compound particles 15 are not present in the circuit layer 12 and the metal layer 13 and there is a microstructure in which Cu is solid-solubilized in the Al matrix.

After carrying out 2000 thermal cycles, in which one cycle is holding at −65° C. for 5 minutes and holding at 150° C. for 5 minutes, as shown in FIG. 3(b) and FIG. 4, the crystal grains are refined and the Al—Cu compound particles 15 including Al and Cu are confirmed on the crystal grain boundaries and in the crystal grain.

In the present embodiment, in a range of 50 μm in the thickness direction from the bonding interface to the circuit layer 12 and the metal layer 13 side, the number density of the Al—Cu compound particles 15 precipitated after carrying out 2000 thermal cycles, in which one cycle is holding at −65° C. for 5 minutes and holding at 150° C. for 5 minutes, is preferably set in a range of 0.50 particles/μm$^2$ or more and 8.50 particles/μm$^2$ or less.

The number density of the Al—Cu compound particles 15 is more preferably 0.60 particles/μm$^2$ or more and even more preferably 0.75 particles/μm$^2$ or more. In addition, the number density of the Al—Cu compound particles 15 is more preferably 8.30 particles/μm$^2$ or less and even more preferably 8.10 particles/μm$^2$ or less. In the present embodiment, the number density is calculated for Al—Cu compound particles having a particle diameter of 0.01 μm or more and 2 μm or less. In the calculation of the number density, in a case where the particle shape is not circular, the shortest part (short diameter) is determined as the particle diameter of that particle.

Furthermore, in the present embodiment, the average of the equivalent circle diameters of the Al—Cu compound particles 15 precipitated after carrying out 2000 thermal cycles, in which one cycle is holding at −65° C. for 5 minutes and holding at 150° C. for 5 minutes, is preferably set in a range of 30 nm or more and 130 nm or less.

The average of the equivalent circle diameters of the Al—Cu compound particles 15 is more preferably 37 μm or more and even more preferably 45 μm or more. The average of the equivalent circle diameters of the Al—Cu compound particles 15 is more preferably 125 μm or less and even more preferably 120 μm or less.

Next, a description will be given of the method for manufacturing the insulating circuit substrate 10 which is the present embodiment and the power module 1 using FIG. 5 and FIG. 6.

(Cu Layer Formation Step S01)

Figure 5:
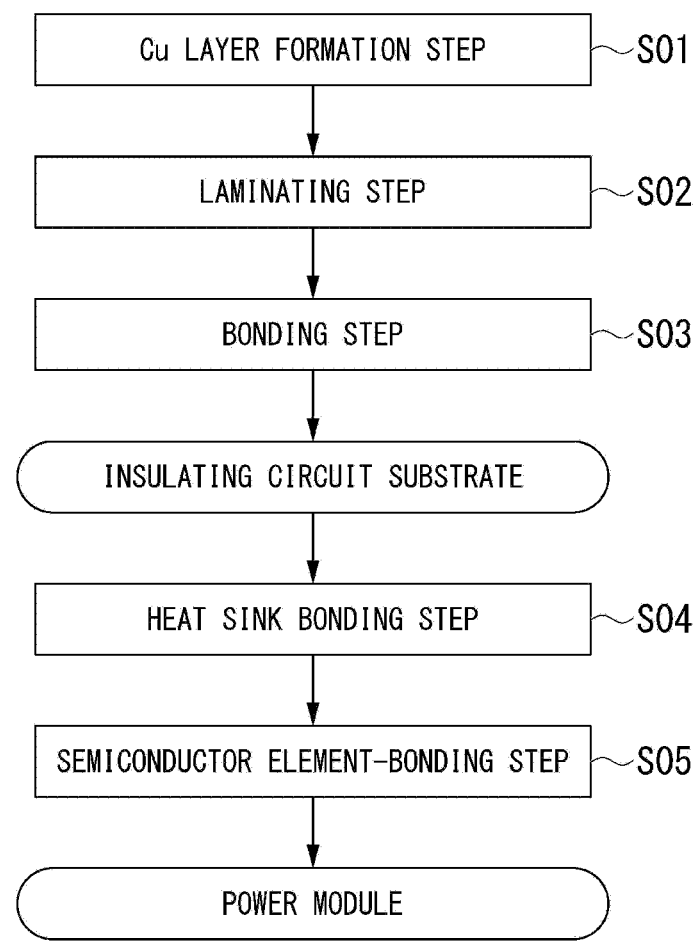
FIG. 5 is a flow diagram showing a method for manufacturing the insulating circuit substrate and power module shown in FIG. 1.
Figure 6:
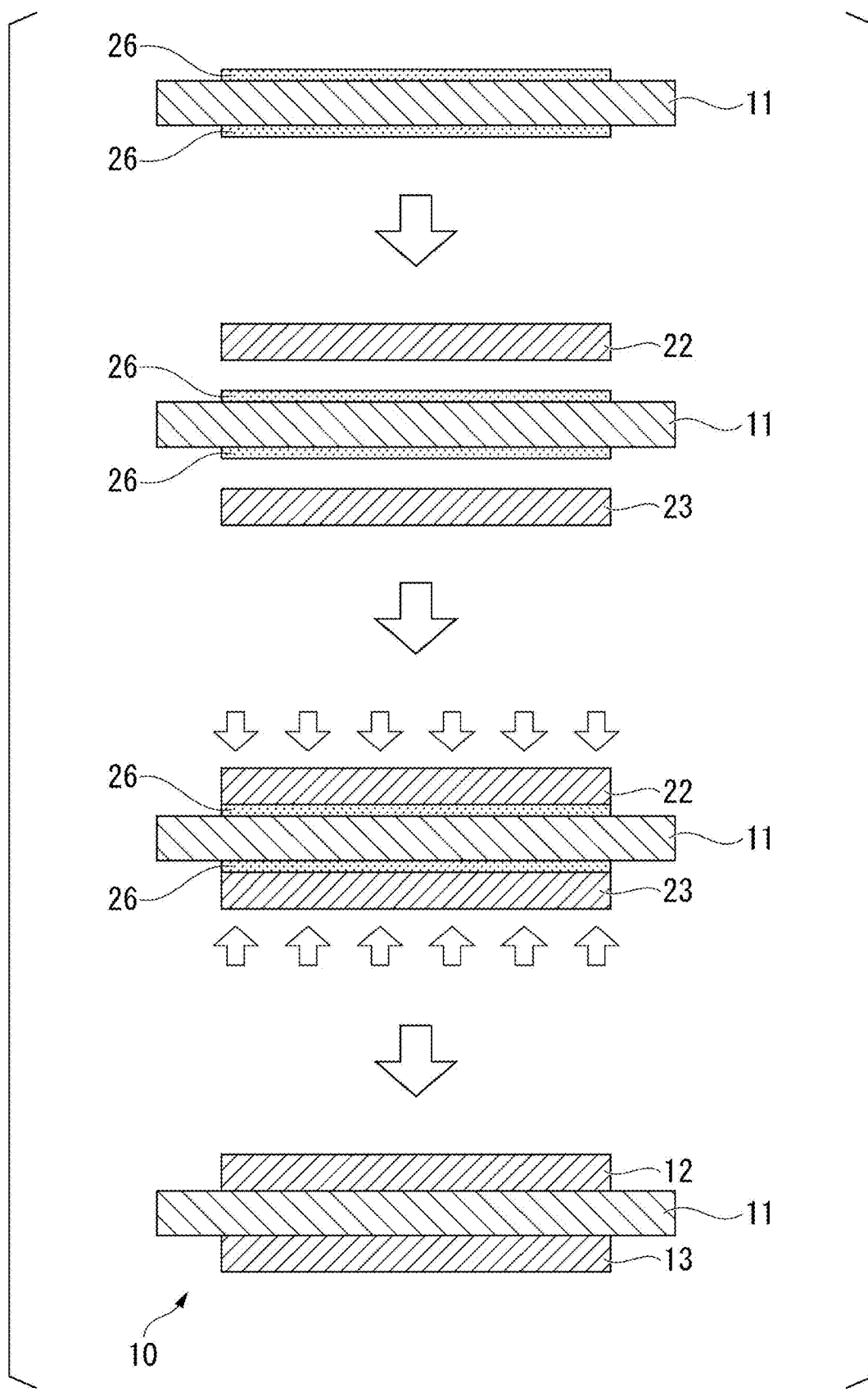
FIG. 6 is an explanatory diagram showing the method for manufacturing the insulating circuit substrate, which is an embodiment of the present invention.

First, as shown in FIG. 5 and FIG. 6, a Cu layer 26 is formed on at least one of the bonding surface between the ceramic substrate 11 and the aluminum sheet 22 which is to be the circuit layer 12 and the bonding surface between the ceramic substrate 11 and the aluminum sheet 23 which is to be the metal layer 13. In the present embodiment, as shown in FIG. 6, the Cu layers 26 are formed on both surfaces of the ceramic substrate 11 respectively. The method for forming the Cu layer 26 is not particularly limited and it is possible to use existing methods such as sputtering, vapor deposition, CVD, plating, paste, foil material, and the like as appropriate.

The adhered amount of Cu in the Cu layer 26 is preferably in a range of 0.08 mg/cm$^2$ or more and 2.0 mg/cm$^2$ or less.

(Laminating Step S02)

Next, the aluminum sheet 22, which becomes the circuit layer 12, is laminated on one surface of the ceramic substrate 11 via the Cu layer 26, and the aluminum sheet 23, which becomes the metal layer 13, is laminated on the other surface of the ceramic substrate 11 via the Cu layer 26.

(Bonding Step S03)

Next, a laminate of the aluminum sheet 22, which becomes the circuit layer 12, the ceramic substrate 11, and the aluminum sheet 23, which becomes the metal layer 13, is charged into a vacuum heating furnace in a state of being pressed in the lamination direction using a pressing apparatus, the aluminum sheet 22 and the ceramic substrate 11 are bonded to form the circuit layer 12, and the aluminum sheet 23 and the ceramic substrate 11 are bonded to form the metal layer 13.

In the bonding step S03, the pressing load in the lamination direction is in a range of 0.098 MPa or more and 2.94 MPa or less.

In addition, the bonding temperature is set in a range of 600° C. or higher and 650° C. or lower and the holding time at the bonding temperature is set to 180 minutes or less.

The temperature increase rate from the eutectic temperature (548° C.) of Al and Cu to the bonding temperature is set in a range of 5° C./min or more and 20° C./min or less.

By the above steps, the insulating circuit substrate 10 which is the present embodiment is manufactured.

(Heat Sink Bonding Step S04)

Next, the heat sink 31 is laminated on the other side of the metal layer 13 of the insulating circuit substrate 10 via a brazing material and the insulating circuit substrate 10 and the heat sink 31 are charged into a vacuum heating furnace in a state of being pressed in the lamination direction to bond the metal layer 13 and the heat sink 31.

(Semiconductor Element-Bonding Step S05)

Next, the semiconductor element 3 is laminated on one surface of the circuit layer 12 via the solder material (solder layer 2) and solder-bonded in the heating furnace.

In the manner described above, the power module 1 shown in FIG. 1 is manufactured.

According to the insulating circuit substrate 10 which is the present embodiment configured as above, Cu is solid-solubilized on the bonding interface sides of the circuit layer 12 and the metal layer 13 with the ceramic substrate 11 and the ratio B/A between the Cu concentration A mass % at the bonding interface and the Cu concentration B mass % at a position of 100 μm in the thickness direction from the bonding interface to the circuit layer 12 and the metal layer 13 side is set to 0.30 or more and 0.85 or less. For this reason, Cu is sufficiently diffused in the inside of the circuit layer 12 and the metal layer 13 formed of aluminum and a region where Cu is solid-solubilized in a supersaturated manner is formed in the vicinity of the bonding interface of the circuit layer 12 and metal layer 13. For this reason, the circuit layer 12 and the metal layer 13 are strengthened and it is possible to suppress deformation of the circuit layer 12 and the metal layer 13 and the occurrence of cracks in the circuit layer 12 and the metal layer 13 after being subjected to thermal cycles.

In addition, since Cu is solid-solubilized in the Al matrix, a hard Al—Cu eutectic phase is not formed and it is possible to suppress the occurrence of breaking in the ceramic substrate 11.

Furthermore, in the present embodiment, in a case where the area ratio of the Al—Cu eutectic phase in a range of 1 mm from an end portion of the bonding interface between either one of the circuit layer 12 or the metal layer 13 and the ceramic substrate 11 toward a center in a width direction is 30% or less, the amount of the hard Al—Cu eutectic phase is small and it is possible to suppress the occurrence of breaking in the ceramic substrate 11.

In the present embodiment, the Cu concentration B at a position of 100 μm in the thickness direction from the bonding interface of the circuit layer 12 and the metal layer 13 with the ceramic substrate 11 is set in a range of 0.04 mass % or more and 0.96 mass % or less, Cu is sufficiently diffused toward the inside of the circuit layer 12 and the metal layer 13, and it is possible to further suppress the deformation of the circuit layer 12 and the metal layer 13 and the occurrence of cracks in the circuit layer 12 and the metal layer 13 after being subjected to thermal cycles.

In the present embodiment, after carrying out 2000 thermal cycles, in which one cycle is holding at −65° C. for 5 minutes and holding at 150° C. for 5 minutes, in a case where the Al—Cu compound particles 15 including Al and Cu are precipitated on the crystal grain boundaries and in the crystal grains of the circuit layer 12 and the metal layer 13 in a region up to 100 μm in the thickness direction from the bonding interface of the circuit layer 12 and the metal layer 13 with the ceramic substrate 11, the vicinity of the bonding interface of the circuit layer 12 and the metal layer 13 with the ceramic substrate 11 is strengthened by the Al—Cu compound particles 15. For this reason, it is possible to reliably suppress deformation of the circuit layer 12 and the metal layer 13 and the occurrence of cracks in the circuit layer 12 and the metal layer 13 after being subjected to thermal cycles.

In the present embodiment, in a range of 50 μm in the thickness direction from the bonding interface to the circuit layer 12 and the metal layer 13 side, after carrying out 2000 thermal cycles, in which one cycle is holding at −65° C. for 5 minutes and holding at 150° C. for 5 minutes, in a case where the number density of the precipitated Al—Cu compound particles is in a range of 0.50 particles/μm$^2$ or more and 8.50 particles/μm$^2$ or less, the deformation resistance in the vicinity of the bonding interface of the circuit layer 12 and the metal layer 13 increases and it is possible to further suppress the deformation of the circuit layer 12 and the metal layer 13. Furthermore, the vicinity of the bonding interface of the circuit layer 12 and the metal layer 13 does not become harder than necessary and it is possible to further suppress breaking in the ceramic substrate 11.

In the present embodiment, in a case where the average equivalent circle diameter of the Al—Cu compound particles 15 is in a range of 30 nm or more and 130 nm or less, it is possible to sufficiently carry out precipitation strengthening of the portions in the vicinity of the bonding interface of the circuit layer 12 and the metal layer 13 and to further suppress the deformation of the circuit layer 12 and the metal layer 13.

Although the embodiments of the present invention are described above, the present invention is not limited thereto and appropriate modification is possible in a range not departing from the technical features of the invention.

For example, in the present embodiment, the ceramic substrate is described as being formed of silicon nitride, but is not limited thereto and may be formed of alumina or may be formed of aluminum nitride.

The present embodiment is described as forming a power module with power semiconductor elements mounted on a circuit layer of an insulating circuit substrate, but is not limited thereto. For example, an LED module may be formed by mounting an LED element on the insulating circuit substrate or a thermoelectric module may be formed by mounting a thermoelectric element on the circuit layer of the insulating circuit substrate.

In addition, in the present embodiment, the insulating circuit substrate (the metal layer) and the heat sink are described as being bonded by brazing, but are not limited thereto and other bonding methods such as solid phase diffusion bonding and TLP may be applied.

Furthermore, in the present embodiment, the heat sink is described as being formed of aluminum, but is not limited thereto and may be formed of copper or the like and may be provided with passages in which a cooling medium travels through an inner portion thereof. In addition, a buffer layer formed of, for example, 4N-aluminum may be provided between the heat sink and the insulating circuit substrate.

EXAMPLES

A description will be given below of the results of confirmatory experiments performed to confirm the effectiveness of the present invention.

Example 1

A ceramic substrate (40 mm×40 mm) shown in Table 1 was prepared and Cu layers were formed by a sputtering method on one surface and the other surface of the ceramic substrate. The adhered amount of Cu at this time is shown in Table 1.

Then, an aluminum sheet (37 mm×37 mm×0.4 mm thickness (t)) formed of 4N aluminum was laminated on one surface of the ceramic substrate via a Cu layer and an aluminum sheet (37 mm×37 mm×0.4 mm thickness (t)) formed of 4N aluminum was laminated on the other surface of the ceramic substrate via a Cu layer.

The aluminum sheet and the ceramic substrate were bonded under the conditions shown in Table 1 to manufacture an insulating circuit substrate. The temperature increase rate shown in Table 1 is the temperature increase rate from the eutectic temperature (548° C.) of Al and Cu to the bonding temperature.

A heat sink (50 mm×60 mm, 5 mm thick aluminum sheet (A6063)) was bonded to the metal layer of the obtained insulating circuit substrate via a buffer layer of 4N-aluminum (thickness 0.9 mm) to obtain an insulating circuit substrate with heat sink. The bonding of the metal layer to the buffer layer and the bonding of the buffer layer to the heat sink were performed by brazing using an Al—Si foil.

For the obtained insulating circuit substrate with heat sink, the Cu concentration A at the bonding interface of the aluminum sheet, the Cu concentration B at the position 100 μm from the bonding interface to the inner portion of the aluminum sheet, the initial bonding rate, the presence or absence of Al—Cu compound particles after the thermal cycle test, the bonding rate after the thermal cycle test, and the presence or absence of breaking of the substrate after the thermal cycle test were evaluated.

(Cu Concentration A, Cu Concentration B)

The insulating circuit substrate with heat sink was cut in cross-section along the lamination direction and quantitative analysis of Cu was performed in the cross-section in the center of the width direction of the substrate using an electron micro analyzer (JXA-8530F manufactured by JEOL Ltd.) under conditions where a magnification was 500 times and an acceleration voltage was 15 kV, at the bonding interface and at a position 100 μm from the bonding interface in the lamination direction. The Cu concentrations at the bonding interface and at a position 100 μm from the bonding interface in the lamination direction in the observation region were determined at five points respectively and the average values thereof were calculated to obtain the Cu concentration A (mass %) at the bonding interface and the Cu concentration B (mass %) at a position of 100 μm from the bonding interface. The sum of the Al and Cu concentrations (mass %) at that time was set to 100 and the Cu concentration was calculated.

(Initial Bonding Rate)

The bonding rate between the aluminum sheet and the ceramic substrate was evaluated. Specifically, in the insulating circuit substrate with heat sink, the bonding rate of the interface between the aluminum sheet and the ceramic substrate was evaluated using an ultrasonic flaw detector (FineSAT200 manufactured by Hitachi Power Solutions Co., Ltd.) and calculated from the following formula. The initial bonding area was set as the area to be bonded before bonding, that is, the area of the circuit layer. In the binarized image of the ultrasonic-detected image, peeling was indicated by the white portion in the bonded part, thus, the area of this white portion was used as the exfoliation area (non-bonded part area).

$$(\text{Bonding rate}) = \{((\text{initial bonding area}) - (\text{non-bonded part area}))/(\text{initial bonding area})\} \times 100.$$

(Thermal Cycle Test)

The insulating circuit substrate with heat sink was subjected to 2000 thermal cycles of −65° C.×5 minutes ↔ 150° C.×5 minutes in a liquid bath (Fluorinert) using a TSB-51 cold thermal shock tester manufactured by ESPEC Corp.

(Presence or Absence of Al—Cu Compound Particles after Thermal Cycle Test)

The insulating circuit substrate with heat sink after the thermal cycles described above was cut in the lamination direction, and then, in the cross-section in the center of the width direction of the substrate, a region (17 μm×23 μm) including the bonding interface between the aluminum sheet and the ceramic substrate was observed using an electron scanning microscope (GeminiSEM 500 manufactured by Carl Zeiss) under conditions where a magnification was 5000 times and an acceleration voltage was 5.0 kV.

In this observation, an SEM image and an elemental MAP of Cu and Al were acquired. In a case where granular regions observed in white were observed in the SEM image and Cu and Al coexisted in these regions, the Al—Cu compound particles were evaluated as "Yes" (present).

The presence or absence of Al—Cu compound particles was evaluated by observing the region to 100 μm in the thickness direction from the bonding interface of the aluminum sheet.

(Bonding Rate after Thermal Cycle Test)

The insulating circuit substrate with heat sink after the thermal cycle test was evaluated using an ultrasonic flaw detector (FineSAT200 manufactured by Hitachi Power Solutions Co., Ltd.) as described above and the bonding rate was calculated.

(Presence or Absence of Breaking of Substrate after Thermal Cycle Test)

For the insulating circuit substrate with heat sink after the thermal cycle test, the presence or absence of breaking of the substrate was evaluated using an ultrasonic flaw detector (FineSAT200 manufactured by Hitachi Power Solutions Co., Ltd.). In a case where breaking was confirmed in any one of the circuit layer, metal layer, or ceramic substrate, the evaluation was "Yes" (breaking present).

In contrast, in Inventive Examples 1 to 8, the ratio B/A between the Cu concentration A mass % at the bonding interface and the Cu concentration B mass % at a position of 100 μm in the thickness direction from the bonding interface to the aluminum sheet side was 0.30 or more and 0.85 or less. In Inventive Examples 1 to 8, the bonding rate was sufficiently high and no breaking was confirmed in the substrate even after the thermal cycle test.

Example 2

A ceramic substrate (40 mm×40 mm) shown in Table 3 was prepared and Cu layers were formed by the sputtering method on one surface and the other surface of the ceramic substrate. The adhered amount of Cu at this time is shown in Table 3.

Then, an aluminum sheet (37 mm×37 mm×0.4 mm thickness (t)) formed of 4N aluminum was laminated on one surface of the ceramic substrate via a Cu layer and an

TABLE 1

| | Ceramic substrate | | Cu adhered | Bonding step | | | |
|---|---|---|---|---|---|---|---|
| | Material | Thickness (mm) | amount (mg/cm²) | Pressing load (MPa) | Temperature increase rate (° C./min) | Bonding temperature (° C.) | Holding time (min) |
| Inventive Example 1 | Si₃N₄ | 0.32 | 0.36 | 0.490 | 5 | 650 | 25 |
| Inventive Example 2 | Si₃N₄ | 0.32 | 0.36 | 0.980 | 10 | 640 | 30 |
| Inventive Example 3 | Si₃N₄ | 0.32 | 1.79 | 0.980 | 15 | 600 | 100 |
| Inventive Example 4 | Al₂O₃ | 0.635 | 0.89 | 0.196 | 5 | 630 | 60 |
| Inventive Example 5 | Al₂O₃ | 0.635 | 0.09 | 0.098 | 20 | 640 | 180 |
| Inventive Example 6 | AlN | 0.635 | 0.18 | 0.196 | 10 | 650 | 45 |
| Inventive Example 7 | AlN | 0.635 | 0.89 | 0.490 | 20 | 620 | 60 |
| Inventive Example 8 | AlN | 0.635 | 0.72 | 0.196 | 15 | 640 | 120 |
| Comparative Example 1 | AlN | 0.635 | 0.36 | 0.490 | 10 | 630 | 20 |
| Comparative Example 2 | Si₃N₄ | 0.32 | 0.89 | 0.196 | 15 | 620 | 20 |
| Comparative Example 3 | AlN | 0.635 | 0.72 | 0.490 | 10 | 610 | 30 |
| Comparative Example 4 | Al₂O₃ | 0.635 | 0.09 | 0.196 | 5 | 640 | 15 |

TABLE 2

| | Cu concentration A at bonding interface (mass %) | Cu concentration B at 100 μm position (mass %) | B/A | Initial bonding rate | Thermal cycle test | | |
|---|---|---|---|---|---|---|---|
| | | | | | Presence or absence of Al-Cu compound particles | Bonding rate (%) | Presence or absence of breaking in substrate |
| Inventive Example 1 | 0.48 | 0.16 | 0.33 | 99.8 | Present | 98.6 | Absent |
| Inventive Example 2 | 0.48 | 0.15 | 0.31 | 99.1 | Present | 97.5 | Absent |
| Inventive Example 3 | 1.98 | 0.95 | 0.48 | 99.0 | Present | 96.7 | Absent |
| Inventive Example 4 | 0.95 | 0.49 | 0.51 | 97.9 | Present | 95.1 | Absent |
| Inventive Example 5 | 0.05 | 0.04 | 0.83 | 97.3 | Present | 93.2 | Absent |
| Inventive Example 6 | 0.18 | 0.10 | 0.54 | 97.9 | Present | 95.8 | Absent |
| Inventive Example 7 | 1.03 | 0.45 | 0.43 | 99.9 | Present | 96.6 | Absent |
| Inventive Example 8 | 0.48 | 0.36 | 0.74 | 98.5 | Present | 94.6 | Absent |
| Comparative Example 1 | 0.25 | 0.22 | 0.86 | 99.1 | Present | 80.8 | Present |
| Comparative Example 2 | 1.79 | 0.14 | 0.08 | 97.0 | Absent | 88.9 | Present |
| Comparative Example 3 | 1.30 | 0.16 | 0.13 | 99.6 | Absent | 88.0 | Present |
| Comparative Example 4 | 0.17 | 0.02 | 0.10 | 97.3 | Absent | 82.9 | Present |

In Comparative Examples 1 to 4, the ratio B/A between the Cu concentration A mass % at the bonding interface and the Cu concentration B mass % at a position of 100 μm in the thickness direction from the bonding interface to the aluminum sheet side was less than 0.30 or more than 0.85. In Comparative Examples 1 to 4, the bonding rate after the thermal cycle test was low and breaking was observed in the substrate after the thermal cycle test.

aluminum sheet (37 mm×37 mm×0.4 mm thickness (t)) formed of 4N aluminum was laminated on the other surface of the ceramic substrate via a Cu layer.

The aluminum sheet and the ceramic substrate were bonded under the conditions shown in Table 3 to manufacture an insulating circuit substrate.

For the obtained insulating circuit substrate, the Cu concentration A at the bonding interface of the aluminum sheet, the Cu concentration B at the position 100 μm from the bonding interface to the inner portion of the aluminum sheet, the initial bonding rate, the bonding rate after the thermal cycle test, and the presence or absence of breaking of the substrate after the thermal cycle test were evaluated using the same procedure as in Example 1.

In addition, the area ratio of the Al—Cu eutectic phase at the bonding interface, the number density of the Al—Cu compound particles after the thermal cycle test, and the average equivalent circle diameter of the Al—Cu compound particles were evaluated as follows.

(Area Ratio of Al—Cu Eutectic Phase at Bonding Interface)

At the bonding interface, a BSE image in the range of 1 mm from the end portion in the width direction toward the center was obtained by an electron scanning microscope (GeminiSEM 500 manufactured by Carl Zeiss) and this BSE image was binarized. The area of the Al—Cu eutectic phase and the area in a range up to 1 mm from the end portion of the bonding interface were determined and the area ratio of the Al—Cu eutectic phase at the bonding interface was calculated using the following formula.

(Area Ratio of Al—Cu eutectic phase)={(area of Al—Cu eutectic phase)/(area from end portion to 1 mm toward center)}×100.

(Number Density of Al—Cu Compound Particles after Thermal Cycle Test)

The insulating circuit substrate after the thermal cycle test described above was cut in the lamination direction. Next, the presence or absence of Al—Cu compound particles was confirmed in the cross-section at the center of the substrate in the width direction by the method described above. In the region where Al—Cu compound particles were confirmed (in a range of 50 µm in the thickness direction from the bonding interface to the aluminum sheet side), an ASB image at a 1000-fold magnification was acquired using an electron scanning microscope (GeminiSEM 500 manufactured by Carl Zeiss) and the ASB image was binarized such that the Al—Cu compound particles were white.

The number of Al—Cu compound particles was measured and divided by the area of the measurement range to calculate the number density. The number density was calculated for Al—Cu compound particles having a particle diameter of 0.01 µm or more and 2 µm or less as a target. In addition, in a case where the particle shape was not circular, the shortest portion (short diameter) was determined as the particle diameter of that particle. Furthermore, in a case where the particle shape was unknown because part of the particle was outside the measurement range or the like, the measurement was carried out after excluding this particle.

(Average Equivalent Circle Diameter of Al—Cu Compound Particles after Thermal Cycle Test)

The ASB image was binarized in the same manner as for the number density measurement method. Next, the area of each Al—Cu compound particle in the measurement region was determined, the equivalent circle diameter was calculated from this area, and the average value of the equivalent circle diameters was obtained. These average values are shown in Table 4. When determining the area, in cases where it was not possible to determine the area because a part of the particles was outside the measurement range, these particles were excluded.

TABLE 3

| | Ceramic substrate | | Cu adhered amount (mg/cm$^2$) | Bonding step | | | |
|---|---|---|---|---|---|---|---|
| | Material | Thickness (mm) | | Pressing load (MPa) | Temperature increase rate (° C./min) | Bonding temperature (° C.) | Holding time (min) |
| Inventive Example 11 | Si$_3$N$_4$ | 0.32 | 0.18 | 0.980 | 5 | 620 | 60 |
| Inventive Example 12 | Si$_3$N$_4$ | 0.32 | 1.79 | 0.196 | 15 | 640 | 30 |
| Inventive Example 13 | Si$_3$N$_4$ | 0.32 | 0.36 | 0.588 | 15 | 650 | 45 |
| Inventive Example 14 | Al$_2$O$_3$ | 0.635 | 0.89 | 0.294 | 5 | 640 | 60 |
| Inventive Example 15 | Al$_2$O$_3$ | 0.635 | 0.18 | 0.588 | 20 | 630 | 45 |
| Inventive Example 16 | AlN | 0.635 | 0.89 | 0.392 | 20 | 610 | 60 |
| Inventive Example 17 | AlN | 0.635 | 0.36 | 0.098 | 10 | 650 | 30 |
| Inventive Example 18 | AlN | 0.635 | 0.72 | 0.490 | 15 | 630 | 100 |

TABLE 4

| | Cu concentration A at bonding interface (mass %) | Cu concentration B at 100 µm position (mass %) | B/A | Area ratio of Al-Cu eutectic phase (%) | Thermal cycle test | | | |
|---|---|---|---|---|---|---|---|---|
| | | | | | Initial bonding rate | Al-Cu compound particles | | Presence or absence of breaking of substrate |
| | | | | | | Number density (particles/µm$^2$) | Equivalent circle diameter (nm) | Bonding rate (%) | |
| Inventive Example 11 | 0.51 | 0.21 | 0.41 | 16.9 | 98.7 | 2.40 | 101 | 98.0 | Absent |
| Inventive Example 12 | 1.88 | 0.64 | 0.34 | 32.0 | 98.2 | 7.80 | 46 | 96.6 | Absent |
| Inventive Example 13 | 0.23 | 0.12 | 0.52 | 19.0 | 99.4 | 0.72 | 117 | 99.4 | Absent |
| Inventive Example 14 | 0.94 | 0.57 | 0.61 | 22.5 | 99.8 | 8.70 | 27 | 94.5 | Absent |
| Inventive Example 15 | 0.57 | 0.23 | 0.40 | 6.2 | 98.7 | 8.10 | 37 | 99.5 | Absent |

TABLE 4-continued

|  | Cu concentration A at bonding interface (mass %) | Cu concentration B at 100 μm position (mass %) | B/A | Area ratio of Al-Cu eutectic phase (%) | Initial bonding rate | Thermal cycle test | | | Presence or absence of breaking of substrate |
|---|---|---|---|---|---|---|---|---|---|
|  |  |  |  |  |  | Al-Cu compound particles | | | |
|  |  |  |  |  |  | Number density (particles/μm²) | Equivalent circle diameter (nm) | Bonding rate (%) | |
| Inventive Example 16 | 1.03 | 0.48 | 0.47 | 12.7 | 99.2 | 0.47 | 133 | 92.7 | Absent |
| Inventive Example 17 | 0.39 | 0.14 | 0.36 | 8.6 | 99.3 | 0.64 | 124 | 98.4 | Absent |
| Inventive Example 18 | 0.51 | 0.37 | 0.73 | 26.2 | 99.1 | 8.40 | 31 | 98.2 | Absent |

In Inventive Examples 11, 13, 15, 17, and 18, in a range of 50 urn in the thickness direction from the bonding interface to the aluminum sheet side, after carrying out 2000 thermal cycles, in which one cycle is holding at −65° C. for 5 minutes and holding at 150° C. for 5 minutes, the number density of the precipitated Al—Cu compound particles was in a range of 0.50 particles/μm² or more and 8.50 particles/μm² or less. The average equivalent circle diameter of the Al—Cu compound particles was in a range of 30 nm or more and 130 nm or less. At the bonding interface between the aluminum sheet and the ceramic substrate, the area ratio of the Al—Cu eutectic phase in a range of 1 mm from the end portion in the width direction toward the center of the bonding interface was 30.0% or less. Even after the thermal cycle test, the bonding rate was sufficiently high and no breaking was confirmed in the substrate.

In addition, in Inventive Example 12, the area ratio of the Al—Cu eutectic phase was 32.0%. In Inventive Example 14, the number density of Al—Cu compound particles after the thermal cycle test was 8.70 particles/m² and the equivalent circle diameter of the Al—Cu compound particles was 27 nm. In Inventive Example 16, the number density of Al—Cu compound particles after the thermal cycle test was 0.47 particles/μm² and the equivalent circle diameter of the Al—Cu compound particles was 133 nm. Compared to Inventive Examples 12, 14, and 16, in Inventive Examples 11, 13, 15, 17, and 18, the area ratio of the Al—Cu eutectic phase was 30.0% or less, the number density of the Al—Cu compound particles after the thermal cycle test was in a range of 0.50 particles/μm² or more and 8.50 particles/μm² or less, and the equivalent circle diameter of the Al—Cu compound particles was 30 nm or more and 130 nm or less. It was confirmed that the bonding rate was even better in Inventive Examples 11, 13, 15, 17, and 18 than that in Inventive Examples 12, 14, and 16.

From the results of these Examples, it was confirmed that, according to the Inventive Examples, it is possible to provide an insulating circuit substrate which is able to suppress breaking in a ceramic substrate, deformation of the circuit layer (the metal layer), and the like, even in a case of being subjected to severe thermal cycles, and which has excellent bonding reliability between the ceramic substrate and the circuit layer.

INDUSTRIAL APPLICABILITY

It is possible to suitably apply the insulating circuit substrate of the present embodiment to power modules, LED modules, and thermoelectric modules.

EXPLANATION OF REFERENCE SIGNS

1: Power module
3: Semiconductor element
10: Insulating circuit substrate
11: Ceramic substrate
12: Circuit layer
13: Metal layer
15: Al—Cu compound particles
22, 23: Aluminum sheet

What is claimed is:

1. An insulating circuit substrate in which an aluminum sheet formed of aluminum or an aluminum alloy is laminated and bonded to a surface of a ceramic substrate,
wherein, in the aluminum sheet, Cu is solid-solubilized at a bonding interface with the ceramic substrate, and a ratio B/A between a Cu concentration A mass % at the bonding interface and a Cu concentration B mass % at a position of 100 μm in a thickness direction from the bonding interface to the aluminum sheet side is 0.30 or more and 0.85 or less.

2. The insulating circuit substrate according to claim 1, wherein, in the aluminum sheet, the Cu concentration B at a position of 100 μm in the thickness direction from the bonding interface is set in a range of 0.04 mass % or more and 0.96 mass % or less.

3. The insulating circuit substrate according to claim 1, wherein after carrying out 2000 thermal cycles, in which one cycle is holding at −65° C. for 5 minutes and holding at 150° C. for 5 minutes, in a region up to 100 μm in the thickness direction from the bonding interface of the aluminum sheet, Al-Cu compound particles including Al and Cu are precipitated at a crystal grain boundary and in a crystal grain of the aluminum sheet.

4. The insulating circuit substrate according to claim 3, wherein, in a range of 50 μm in the thickness direction from the bonding interface to the aluminum sheet side, a number density of the Al-Cu compound particles precipitated after carrying out 2000 thermal cycles, in which one cycle is holding at −65° C. for 5 minutes and holding at 150° C. for 5 minutes, is in a range of 0.50 particles/μm² or more and 8.50 particles/μm² or less.

5. The insulating circuit substrate according to claim 3, wherein an average of equivalent circle diameters of the Al-Cu compound particles precipitated after carrying out 2000 thermal cycles, in which one cycle is holding at −65° C. for 5 minutes and holding at 150° ° C. for 5 minutes, is in a range of 30 nm or more and 130 nm or less.

6. The insulating circuit substrate according to claim 1, wherein, at the bonding interface between the aluminum sheet and the ceramic substrate, an area ratio of an Al-Cu eutectic phase in a range of 1 mm from an end portion of the bonding interface toward a center in a width direction is 30% or less.

7. The insulating circuit substrate according to claim 2, wherein after carrying out 2000 thermal cycles, in which one cycle is holding at −65° C. for 5 minutes and holding at 150° C. for 5 minutes, in a region up to 100 μm in the thickness direction from the bonding interface of the aluminum sheet, Al-Cu compound particles including Al and Cu are precipitated at a crystal grain boundary and in a crystal grain of the aluminum sheet.

8. The insulating circuit substrate according to claim 7, wherein, in a range of 50 μm in the thickness direction from the bonding interface to the aluminum sheet side, a number density of the Al-Cu compound particles precipitated after carrying out 2000 thermal cycles, in which one cycle is holding at −65° C. for 5 minutes and holding at 150° C. for 5 minutes, is in a range of 0.50 particles/μm$^2$ or more and 8.50 particles/μm$^2$ or less.

9. The insulating circuit substrate according to claim 4, wherein an average of equivalent circle diameters of the Al-Cu compound particles precipitated after carrying out 2000 thermal cycles, in which one cycle is holding at −65° C. for 5 minutes and holding at 150° C. for 5 minutes, is in a range of 30 nm or more and 130 nm or less.

10. The insulating circuit substrate according to claim 7, wherein an average of equivalent circle diameters of the Al-Cu compound particles precipitated after carrying out 2000 thermal cycles, in which one cycle is holding at −65° C. for 5 minutes and holding at 150° C. for 5 minutes, is in a range of 30 nm or more and 130 nm or less.

11. The insulating circuit substrate according to claim 8, wherein an average of equivalent circle diameters of the Al-Cu compound particles precipitated after carrying out 2000 thermal cycles, in which one cycle is holding at −65° C. for 5 minutes and holding at 150° C. for 5 minutes, is in a range of 30 nm or more and 130 nm or less.

12. The insulating circuit substrate according to claim 2, wherein, at the bonding interface between the aluminum sheet and the ceramic substrate, an area ratio of an Al-Cu eutectic phase in a range of 1 mm from an end portion of the bonding interface toward a center in a width direction is 30% or less.

13. The insulating circuit substrate according to claim 3, wherein, at the bonding interface between the aluminum sheet and the ceramic substrate, an area ratio of an Al-Cu eutectic phase in a range of 1 mm from an end portion of the bonding interface toward a center in a width direction is 30% or less.

14. The insulating circuit substrate according to claim 4, wherein, at the bonding interface between the aluminum sheet and the ceramic substrate, an area ratio of an Al-Cu eutectic phase in a range of 1 mm from an end portion of the bonding interface toward a center in a width direction is 30% or less.

15. The insulating circuit substrate according to claim 5, wherein, at the bonding interface between the aluminum sheet and the ceramic substrate, an area ratio of an Al-Cu eutectic phase in a range of 1 mm from an end portion of the bonding interface toward a center in a width direction is 30% or less.

16. The insulating circuit substrate according to claim 7, wherein, at the bonding interface between the aluminum sheet and the ceramic substrate, an area ratio of an Al-Cu eutectic phase in a range of 1 mm from an end portion of the bonding interface toward a center in a width direction is 30% or less.

17. The insulating circuit substrate according to claim 8, wherein, at the bonding interface between the aluminum sheet and the ceramic substrate, an area ratio of an Al-Cu eutectic phase in a range of 1 mm from an end portion of the bonding interface toward a center in a width direction is 30% or less.

18. The insulating circuit substrate according to claim 9, wherein, at the bonding interface between the aluminum sheet and the ceramic substrate, an area ratio of an Al-Cu eutectic phase in a range of 1 mm from an end portion of the bonding interface toward a center in a width direction is 30% or less.

19. The insulating circuit substrate according to claim 10, wherein, at the bonding interface between the aluminum sheet and the ceramic substrate, an area ratio of an Al-Cu eutectic phase in a range of 1 mm from an end portion of the bonding interface toward a center in a width direction is 30% or less.

20. The insulating circuit substrate according to claim 11, wherein, at the bonding interface between the aluminum sheet and the ceramic substrate, an area ratio of an Al-Cu eutectic phase in a range of 1 mm from an end portion of the bonding interface toward a center in a width direction is 30% or less.

* * * * *